(12) United States Patent
Raghavan et al.

(10) Patent No.: US 7,848,543 B2
(45) Date of Patent: Dec. 7, 2010

(54) METHOD AND SYSTEM FOR PREDICTION AND MANAGEMENT OF MATERIAL AND INFORMATION TRANSPORT IN AN ORGANISM

(75) Inventors: Raghu Raghavan, Baltimore, MD (US); Timothy Poston, Bangalore Karnataka (IN)

(73) Assignee: BrainLAB AG, Feldkirchen (DE)

( * ) Notice: Subject to any disclaimer, the term of this patent is extended or adjusted under 35 U.S.C. 154(b) by 2114 days.

(21) Appl. No.: 10/771,545

(22) Filed: Feb. 5, 2004

(65) Prior Publication Data

US 2005/0186544 A1  Aug. 25, 2005

(51) Int. Cl.
G06K 9/00  (2006.01)
(52) U.S. Cl. ...................................... 382/113; 382/128
(58) Field of Classification Search ................. 382/128, 382/113; 703/11
See application file for complete search history.

(56) References Cited

U.S. PATENT DOCUMENTS

| | | | |
|---|---|---|---|
| 5,003,497 A * | 3/1991 | Priem | 345/419 |
| 5,205,289 A | 4/1993 | Hardy et al. | |
| 5,583,902 A | 12/1996 | Bae | |
| 5,720,720 A | 2/1998 | Laske et al. | |
| 5,735,814 A | 4/1998 | Elsberry et al. | |
| 5,919,135 A | 7/1999 | Lemelson | |
| 5,964,705 A | 10/1999 | Truwit et al. | |
| 6,026,316 A | 2/2000 | Kucharczyk et al. | |
| 6,061,587 A | 5/2000 | Kucharczyk et al. | |
| 6,119,065 A * | 9/2000 | Shimada et al. | 701/201 |
| 6,210,967 B1 * | 4/2001 | Bard | 435/361 |
| 6,293,282 B1 | 9/2001 | Lemelson | |
| 6,549,803 B1 | 9/2001 | Lemelson | |
| 6,381,562 B2 * | 4/2002 | Keane | 703/11 |
| 6,446,055 B1 * | 9/2002 | Grand | 706/10 |
| 6,464,662 B1 | 10/2002 | Raghavan et al. | |
| 6,572,579 B1 | 6/2003 | Raghavan et al. | |
| 6,836,569 B2 * | 12/2004 | Le Pennec et al. | 382/260 |
| 7,182,933 B2 * | 2/2007 | Goetz et al. | 424/9.1 |
| 7,195,761 B2 | 3/2007 | Holtzman et al. | |

(Continued)

FOREIGN PATENT DOCUMENTS

EP  0 702 966  3/1996

(Continued)

OTHER PUBLICATIONS

U.S. Appl. No. 11/115,093, filed Apr. 2005, Birkenbach et al.

*Primary Examiner*—Matthew C Bella
*Assistant Examiner*—Dennis Rosario
(74) *Attorney, Agent, or Firm*—Renner, Otto, Boisselle & Sklar, LLP

(57) ABSTRACT

A method and system for mapping anatomical connection and signaling across a multiplicity of channels, channel contents, and channel speed. In particular, the anatomical connection and signaling is mapped in relation to the human brain. Constructs a three-dimensional, dynamically structured, active model, for general or individual patterns. Uses for the present invention include: risk reduction in surgery to significant channels; planning cell insertion at sites where they can be expected to migrate to a less reachable target site; guiding searches for metastatic tumors; indirectly localizing brain structures; constructing models of disease in which multiple sites are involved in the deficit and any proposed repair; and building simulation of normal processes which require the sequential interaction of multiple sites.

39 Claims, 9 Drawing Sheets

U.S. PATENT DOCUMENTS

| | | |
|---|---|---|
| 7,266,227 B2 | 9/2007 | Pedain et al. |
| 7,305,331 B2 * | 12/2007 | Allen et al. .................. 703/11 |
| 2002/0010384 A1 | 1/2002 | Shahidi et al. |
| 2002/0168618 A1 | 11/2002 | Anderson et al. |
| 2003/0028090 A1 | 2/2003 | Raghavan et al. |
| 2004/0006259 A1 | 1/2004 | Pedain |
| 2004/0043418 A1 | 3/2004 | Holtzman et al. |
| 2004/0138551 A1 | 7/2004 | Hartlep et al. |
| 2004/0215143 A1 | 10/2004 | Brady et al. |
| 2004/0236554 A1 | 11/2004 | Raghavan et al. |
| 2005/0186544 A1 | 8/2005 | Raghavan et al. |

FOREIGN PATENT DOCUMENTS

| | | |
|---|---|---|
| EP | 0 904 735 | 3/1999 |
| WO | 91/18552 | 12/1991 |
| WO | 00 71169 | 11/2000 |
| WO | 01/67979 | 9/2001 |
| WO | 01 85230 | 11/2001 |
| WO | 02/061371 | 8/2002 |

* cited by examiner

METHOD AND SYSTEM FOR PREDICTION AND MANAGEMENT OF MATERIAL AND INFORMATION TRANSPORT IN AN ORGANISM

This application incorporates by reference U.S. Pat. No. 6,549,803 issued Apr. 15, 2003 (application Ser. No. 09/566,478, filed May 8, 2000) and titled "A Method and Device for Targeting Material Delivery to Tissues" and U.S. patent application Ser. No. 09/745,039, filed Dec. 20, 2000 and titled "A Method for Dynamic Characterization of Density Fields in a Compound Structure".

BACKGROUND OF THE INVENTION

1. Field of the Invention

The present invention relates to the field of characterizing and modeling the interaction between tissues and organs in an organism, by exchange of neural signals or of chemical or cellular material.

2. Related Art

In both paper and digital forms, there are numerous biomedical "atlases". A substantial number of these map the human brain. Other atlases map other parts of the body, or part of another species, such as the brain of the rat. Uniformly, these atlases resemble the physical or ecological aspect of a geographical atlas: the pages that subdivide the world into land and sea, high and low, forest and tundra. There are three important types of mapping. Segmentational mapping divides the world into a set of discrete regions, such as political pages in a geographical atlas. Classificatory mapping describes continuous quantities, such as rainfall or height above sea level. Communication mapping describes paths that can be taken for certain journeys.

Early communication maps of the ocean were widely covered with rhumb lines. Rhumb lines are constant-compass-heading paths appropriate for a large set of typical journeys. Rhumb lines became less necessary with the invention of the Mercator projection, which made it possible to take two points, draw a rhumb line with a ruler, and find the corresponding compass heading with a simple protractor reading. Rhumb lines became obsolete with the development of reliable longitude measurements, which let navigators accurately follow the variable heading Great Circle routes. However, trade route maps remain important in planning navigation commerce and managing seaborne empires. In addition, the rise of land transport increased the importance of trade routes in road and rail atlases. In fact, typical U.S. drivers carry an atlas where the state and county boundary lines are less conspicuous than the highways or trade routes.

In an organism, and particularly in the brain of an organism, communication pathways are important. For example, the white matter of the brain is a mass of communicating neural material, analogous to the jumble of wires connecting the digital devices in an office. Specialized bundles of neurons are called nerves. The optic nerve connects an eye to the image processing and analysis services of the visual cortex at the back of the head.

As another example, damage to a brain artery deprives oxygen to the brain cells downstream of the lesion (damage), so that blood flow pathways determine the effects of a stroke. Blood vessels transmit chemical signals, either as part of the general circulation (melatonin passes into the blood as an "all points bulletin" detected throughout the body) or by specialized anatomy, such as the portal veins that specifically connect the lower hypothalamus to the anterior pituitary.

Moreover, the same structure may serve as a pathway for more than one form of communication, at more than one speed. If a bundle of white matter neurons provides a direct nerve-signal connection between two regions of gray matter, the crawl space between them creates a preferred migration route for unattached cancer cells in metastasis, and perhaps in the future for therapeutically inserted cells or microscopic devices.

It is thus of major medical importance to map these communication pathways. Traditional anatomical atlases represent these communication pathways extremely poorly. For example, FIG. 1 displays a typical slice from a standard brain atlas, showing region outlines precisely, and neural connections as dotted planar curves. Humans, and human heads, are quite variously shaped. To apply a generic map to a particular individual requires adjustment. In brain surgery the standard adjustment is the Talairach-Toumoux brain coordinate system. This locates the symmetry plane, selects two points in it that define a horizontal, and scales blocks to give a correspondence by which these points and the side, front, bottom and back of the brain match in the reference brain and the brain of the subject. (For a recent survey of such "warping" transformations, see A. W. Toga & J. C. Mazziotta, Brain Mapping, Vols. 1-3, (2000).) Nerve connections in the Talairach-Toumoux system are shown by sketchy dotted lines projected onto these planar slices. Since it is rare for a nerve connection to actually lie within any flat plane, let alone one chosen for slicing, such projections cannot and do not try to fully specify the shape of the nerve connection. The nerve connections usually take the shortest, straightest route, circumventing objects very closely, but this three-dimensional (3D) circumvention cannot be displayed in the flattened two-dimensional (2D) imaging of the atlas. Thus, the representation of communication pathways by flat planes or 2D imaging is a limitation in the current art.

Another example of current deficiencies in the present art is shown in FIG. 2, which displays a typical published route or "road map" of lymphatic connections in the breast region. (This is available at http://webmd.lycos.com/content/dmk/dmk article 3961314). The use of this "road map" requires the user to have strong 3D understanding to interpret 2D points in the breast that are at risk, since it is not integrated with a computable model of the anatomy. Thus, relying on the user's interpretation of images is a limitation in the current art.

A third example of current deficiencies in the present art is shown in FIG. 3, which displays a 2D density function (as contours and as a graph) analogous to the 3D densities from which it is desirable to extract branching curves representing channels. This mapping process is discussed in John Reintgen et al., Accurate Nodal Staging of Malignant Melanoma 7 (http://www.moffitt.usf.edu/cnaejrnl/v2n5/article4.html). As above, this mapping process relies on the user's interpretation of 2D images. A detectable marker material (such as vital blue dye or technetium-labeled sulfur colloid) is injected at the site of the primary melanoma to determine the nearby lymph nodes at which measurable quantities of the marker appear. The transport processes themselves are neither mapped nor modeled by more than a geometric model. This mapping of a geometric model is not as preferable as a dynamic model or an active model. In our usage, a geometric model specifies positions of points, curves, surfaces and solids, a dynamic model specifies interactions between parts, while an active model embodies these interactions. For example, the geometric model of a car engine specifies the shapes and relative positions of its parts. The dynamic model of a car engine specifies the internal combustion process, the transmission of forces, the control mechanisms, etc. However, it is still mere description (e.g., via the equations that must be solved to determine what happens). The active model contains processes (moving wheels for a mechanical solar system model, sequenced numerical events in a digital model) that correspond to processes in the system it models. In the car engine example, the active model includes an equation solver that, given inclination of the road, pressure on the accelerator, etc., computes combustion rates and forces according to the rules in a dynamic model, and produces specific numbers for the motion of the car. Thus, there is a need for dynamic models, active models built on the dynamic models, and geometric models. There is a further need for an organizational system that groups active models of subsystems into a larger active model.

DESCRIPTION OF THE INVENTION

The present invention is a systematic digital approach to mapping anatomical connection and signaling across a multiplicity of channels, channel contents, and channel speeds. The present invention constructs, on the basis of measured properties, a 3D, dynamic, active model. Using this 3D, dynamic, active model, which can be patterned generally or individually, transport can be simulated. The model can be either a generic model or an individual model, such as a patient. The biological structure may be both a communication channel and an entity with 3D extent and internal function.

The present invention comprises executable computer code, data, and means by which the system may be brought to represent the spatial interactions of an organism. A preferred embodiment of the present invention is as code in an object-oriented programming language such as C++ or Java. The fundamental entity in such code is the class and its member objects and member functions.

Software Objects

Figure 4:
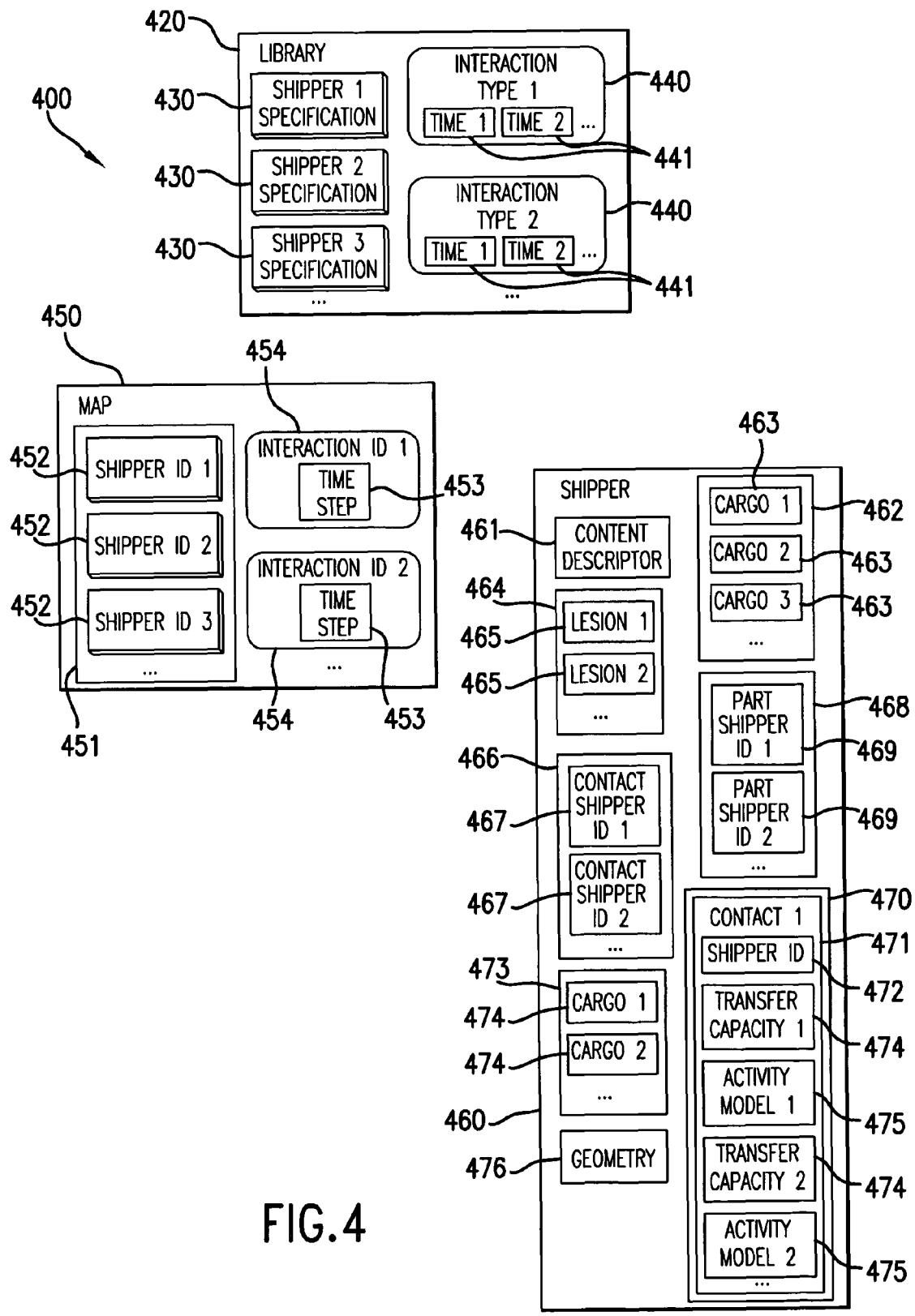
FIG. 4 illustrates software objects, according to one embodiment of the present invention.

FIG. 4 displays the primary software objects 400 and the relationship between these objects in a preferred embodiment.

Shippers. Because the invention has very broad applications, rather than distinguishing objects and channels, the present invention will be described as a single class of user-modifiable objects, called Shippers 410. Each Shipper contains internal variables, described below, comprising, but not limited to, the content of material which is to be shipped.

Library. The Library 420 contains a catalog of available specifications 430 (detailed descriptions) of Shippers. The Library contains the Shippers' multiple hierarchical tags so that they can be displayed to the user according to various schemes chosen by the user. The Library also maintains a database of interaction types 440 and characteristic times 441 for each interaction type. The characteristic times include, but are not limited to: milliseconds for nerve transmission, and minutes or longer units for cell migration over distance. The interaction types include, but are not limited to: nerve impulse, transport by flow, and transport by diffusion. Where an interaction should conserve some quantity, such conservatism is recorded in the Library for use in a consistency check to test whether a simulation does in fact conserve that quantity.

Map. The Map 450 contains a list of active Shipper IDs 452. The user or program may select individual Shippers or groups of Shippers to enter in the current Map, which contains a list of active Shippers. When this list changes it informs each active Shipper of the other active Shippers with which it is in contact. Where a Shipper has options concerning level of detail in its Geometry, the Map stores the current option and updates the Shipper when the user or program requests a change. The Map also stores the interaction ID 454 and the current time step 453 to be used in process modeling, specifying whether the system is to use the state at time t and the dynamics to predict an approximation for the state after one millisecond, three seconds, twelve hours, etc., without examining states in between. (Shorter steps usually produce more accurate approximations, but cost more to cover the same time span.) Optionally, the Map may run interactions of one type with a different time step from interactions of another type. The Map can comply with a request to run a simulation for a specified number of time steps or a specified total of simulated time, or to keep running a simulation until told otherwise. Where computational resources allow, the Map complies with a request to run in "real time", maintaining synchronization between elapsed time as measured on the system clock and elapsed time within the simulation, found by multiplying the time step length by the number of steps executed. This request may be modified by a time warp factor, maintaining a fixed ratio of this factor between the measures of elapsed time. When the Map runs a simulation, it instructs each Shipper to obey that Shipper's internal algorithm concerning the state of its internal variable and the messages it sends to other Shippers about content levels and quantities to be transferred to the Shippers. It is the Map's responsibility to maintain synchrony among the different sub-processes.

World. The World as a software structure exists to contain a pointer (memory locator) to the current Map, and the current global transformation to be applied to geometric coordinates. Other elements may optionally be added, but in our currently preferred implementation the World is fully specified by these elements.

View. The View contains: the relationship between the World coordinates and the View coordinates; the current choice between stereo or monoscopic display; the current user-selected viewpoint (or pair of viewpoints, for stereo display); and a draw function that updates the display by telling the Shippers listed in the Map to draw themselves.

Shippers

Because the invention has very broad applications, rather than distinguishing objects and channels, the present invention will be described as a single class of user-modifiable objects, called Shippers. Each Shipper contains internal variables describing its state, comprising, but not limited to, the content of material 461 which is to be shipped. The content of material may be stored as a single number or as a spatial distribution of concentration, by some convenient means capable of returning a concentration value at a point for which it is to be requested, or a total quantity in the whole or a specified part of the space occupied by the Shipper. (For example, respectively, a Shipper representing the hippocampus may be specified as containing 0.1 mg of a particular drug, as containing 0.0013 mg per cubic centimeter at the coordinate location (1.65, 2.17, 1.82) and analogously for other locations, or as containing 0.075 mg in the left half, 0.025 mg in the right half.) Said convenient means include, but are not limited to: the specification of values on points of a rectangular grid; the specification of coefficients of "finite element" concentration functions of space and optionally of time, and; a list of geometric locations of representative particles.

Each Shipper has Cargoes 463 that it is known to receive and transmit. A Shipper may have one or more types of injury or damage, called Lesions 465. The Lesions may or may not have a geometric location, and this may affect its activity model, the capacity of its contacts, or both.

Each Shipper also has a list of other Shippers with which it is in direct contact, called Contacts 467. In addition, a set of Shippers may be grouped as Parts of another Shipper, which may be run in their place as a "lumped" version. Certain Shippers may be included inside other Shippers as part of a Shipper Hierarchy.

Cargoes. Each Shipper has Cargoes that it is known to receive and transmit. Examples of Cargoes include, but are not limited to: nerve signals (inhibitory, excitatory, complex, etc.), hormones (melatonin, epinephrine, etc.), nutrients (glucose, oxygen, etc.), fluids (blood, serum, cerebrospinal fluid, etc.), cells (transported, migrant, etc.), and drugs (such as an anaesthetic compounds or anti-cancer drug whose effect is desired at a particular point but whose side effects elsewhere must be limited).

Contacts. Each Shipper also has a list of other Shippers with which it is in direct contact. These Shippers are called Contacts 467. Each Contact has a transfer capacity 474 for each Cargo and a default activity model 475 for the Shipper's use of this capacity. Where the Shipper secretes or modifies a Cargo, a more complex activity model may be provided as a default, or added by users of the system.

Geometry. Each Shipper also has at least one Geometry, which can describe the Shipper's form in 1D, 2D or 3D. (For example, sometimes it is convenient to compute with and display the optic nerve as a curved path and the stomach wall as a curved surface. Other times, it is convenient to describe each as a form with thickness, so that it has volume as well as length or area.) The Shipper's contact may include different levels of Geometry. The Geometries are ranked by level of detail.

The Geometries include Variable and Functions. Each Geometry contains a function, containing Variables, by which it can draw itself, when called upon by the View. This function uses the positional information contained in the specification of vertices, segments, patches, etc., and the color information specified at vertices or (in the case of a volume representation) grid points.

For each Variable, and for functions dependent on one or more Variables, each Shipper contains a transfer function which maps the values of the Variable or function to colors associated with the vertices or grid points of the Geometry. This will produce a visual representation of the internal Geometry of the Shipper. A user or program can specify default coloring, which may be uniform or may assign a particular color to one or more lumped or spatially-varying Variables. A user or program may also modify the current choice of transfer function.

The Geometry includes the datum of where in the Library its reference form is stored. This is because the active version used in display and process modeling may use coordinate values resulting from applying a transformation to the reference coordinates, instead of the reference form's coordinate values for its vertices. The default transformation is the global transformation associated with the World, but the Geometry may have its own transformation that replaces or follows the global transformation, modifying the shape of the Geometry without thereby modifying those of its neighbors. When there is a change in the current non-linear transformation, global or individual to the Geometry, it is more efficient to recompute the transformed coordinates directly from the reference coordinates than to reconstruct the reference coordinates by reversing the old transformation. Hence it is useful for the location of the reference coordinates to be easily available.

The Geometry of a Shipper is modifiable, in a number of ways. When a Shipper's Geometry is modified, the system modifies the localization of its contact with other Shippers and consequent changes in capacity. The Geometry of these other Shippers is also modified, if necessary.

If a volumetric scan(s) permits the deduction of local diffusion tensor values, the Geometry of a Shipper may be derived. The Geometry can be defined as a 3D channel along which molecules or cells or microscopic structures whose diffusion is governed by the tensor passes significantly more easily than through surrounding material. In the case of microscopic structures, the extraction procedure may also generate dynamical data such as the channel capacity, which is the relationship between concentrations at points of contact with other structures or at general points along the channel. Such scan-derived diffusion data may also be used to create the dynamical specification appropriate to a Shipper whose Geometry is obtained or created independently of such data, or the dynamical specification may be constructed from general scientific information (for example, the fluid mechanics governing blood flow). With the data structure above, the user can run the system autonomously, exploring the effects of the activity models as the Shippers interact through the passage of Cargoes. The user can also add one or more Shippers (representing, for example, a catheter or electrode) either with a program or through real-time input controls and display. The display can show a 3D image, which shows user-selected Shippers by their 3D Geometry or by their cores, with visual encoding of the rate of transfer of a user-selected subset of Cargoes, and of the level or user-selected variables within the activity models of particular Shippers. The system may also be run by other software which can investigate alternative plans of treatment.

A discussion of the volumetric scan or scans permitting the deduction of local diffusion tensor values can be found in the co-pending, commonly assigned, U.S. Pat. No. 6,549,803 issued Apr. 15, 2003 (application Ser. No. 09/566,478, filed May 8, 2000) and titled "A Method and Device for Targeting Material Delivery to Tissues".

If geometric properties are obtained from algorithms applied to volumetric scans, the Marching Cubes or Skeleton Climbing algorithm techniques can be used. The Marching Cubes technique is described in Lorensen et al. (U.S. Pat. No. 4,710,876) and the Skeleton Climbing technique is described in T. Poston et al., Multi-resolution Isosurface Extraction with Adaptive Skeleton Climbing, 17:3 Computer Graphics Forum 137-148 (September 1998).

An exemplary embodiment of the invention specifies a particular set of Shippers and their Geometries. The Geometries can (but are not required to) be obtained from the following: already-existing digital anatomic models; user input using a system for interacting with a 3D display; surfaces or curves extracted by algorithms applied to volumetric scans; active geometric models that either adapt themselves to image data, adapt themselves to fit between already specified objects, or adapt themselves to both in a combination.

A Geometry can have derived classes. Any object belonging to the Geometry is a copy or instance of one of the derived classes. In an exemplary embodiment of the present invention, the derived classes are:

(a) Finite element curves and networks of various orders, the simplest type being a polygonal curve with straight segments joining a sequence of vertices, the more complex using curved segments such as polynomial curves, equipped with means by which the distance along a segment can be computed;

(b) Finite element surfaces of various orders, the simplest type being a polyhedral surface composed of triangular patches with prescribed vertices, the more complex using curved patched such as nonuniform bi-rational splines (B-splines) between prescribed vertices and matching edges, equipped with mean by which the area of a patch can be computed;

(c) Volume geometries, which may be specified by giving a bounding surface by one of the means in (b) above, or by a rectangular grid of sample points across a region containing the Geometry and a specification for each grid point of whether it is or is not contained in the volume, or implicitly by one or more conditions of the form $f(x, y, z) \geq c$, where f is a computable function and c is a constant. (In the latter case, it may also contain a bounding surface representation for graphical display purposes, unless a ray tracing, ray casting, or other volume rendering method is available and has sufficient speed to use the implicit specification directly while achieving a frame rate sufficient for the user's purposes.)

Volume. A Volume is defined as a class that contains (but is not limited to) the following characteristics. A Volume contains one or more Quantifiers and a position specification. A Quantifier is a function that returns a measure of volume in units such as cubic centimeters, or of content for a material whose point-varying density is specified, of creation/dissipation, of flow through the Volume's interior or boundary, etc., as described in the co-pending, commonly assigned, U.S. patent application Ser. No. 09/745,039, filed Dec. 20, 2000 and titled "A Method for Dynamic Characterization of Density Fields in a Compound Structure."

The position specification is a mapping by which coordinates internal to the Volume may be transformed to World coordinates, and vice versa. In a preferred embodiment, the position specification is a 4×4 matrix identifying an affine transformation (as defined in many texts on computer graphics or geometry, such as C. T. J. Dodson and T. Poston, Tensor Geometry, Springer Graduate Texts in Mathematics) in the standard way (see, for example, Foley and Van Dam).

The Volume is also equipped with functions by which all or part of the Volume may be shown in a graphical display, by means familiar to those skilled in the art. Thus, the Volume may be a member of a Shipper and enter into the internal process simulation of the Shipper, or the Volume may be used strictly as part of the visualization.

Diffuser. A Diffuser is defined as a class that contains (but is not limited to) the following characteristics. A Diffuser contains a concentration field, a diffusion tensor D field, simulation capability functions, and a Pathfinder function.

The concentration field is a class containing a data structure and computational means by which a concentration value may be returned for any point within the Volume. The data structure may be a regular grid of sample values, from which the computational means evaluates concentration values at other points by interpolation; it may be a set of coefficient values for spline, radial basis or wavelet functions, or the like, whose values at a given point may be summed by the computational means with those coefficient values to produce the value at the specified point; or other such means, well known to those skilled in the art. A diffusion tensor field embodies a similar data structure, except that instead of specifying a single number (concentration) at each point, it specifies a symmetric 3×3 matrix, with six independent entries. This is the standard mathematical entity used in a dynamic model of diffusion, to specify the rate of diffusion in particular directions as a result of concentration differences. The simulation capability functions constitute the corresponding active model, computing an approximation of actual flow for specified initial conditions and controlled flow rates, applied pressure differentials, etc., of processes such as injection. These are further discussed in the above-mentioned co-pending, commonly assigned, U.S. Pat. No. 6,549,803 issued Apr. 15, 2003 (application Ser. No. 09/566,478, filed May 8, 2000) and titled "A Method and Device for Targeting Material Delivery to Tissues". (It is important to note that a field of diffusion tensors need not necessarily refer to the diffusion of a physical substance. For example, it may measure the correlation between nerve excitation at a point p and the occurrence of such excitation at points $p'=p+v$ for small vector displacements v, simultaneously or a small time increment later.)

The pathfinder function implements the channel fitting process described below, under "Data-Driven Modeling". Given a diffusion tensor field or a sufficient sampling over time and position of concentrations, it returns a network of curves in the space of the current Volume, along which transport preferentially occurs.

Shipper Hierarchy. Sometimes one selectable Shipper is part of another. (For example, a single portal vein is part of the portal system connecting the hypothalamus to the pituitary. This may be lumped as a single Shipper.) A Shipper Hierarchy manages such relationships and resolves conflicts. For example, one scheme is a division first by species, then by body sections (head, chest, etc.), then by finer subdivisions (within the head: brain, mouth, etc.), etc. Another scheme is a division first by species, then by system (nervous, respiratory, circulatory, lymphatic, etc.).

Two such Shippers should not be computing simultaneously: either the higher Shipper should compute with a lumped model (in the case of the portal system, a pressure/resistance model representing all the veins together, without localizing flow to particular veins), or it should call on its parts to compute, assemble the results, and handle their interactions with other Shippers. (The portal system and an individual vein should not separately transmit to the pituitary, representing the same transfer twice.) A lumped model saves CPU time at the expense of precision; calling on the parts does not reduce the load (or computing burden) on the system, but saves the user invoking each part separately.

Meta-Shipper. A Meta-Shipper, as opposed to a specific instance of a Shipper, contains data and functions that enable it to construct a Shipper of a particular type. (For example, the network of lymph vessels in the breast does not have a single topology occurring in all humans. It is not sufficient to use a standard model and modify its shape continuously, either by a deforming transformation of the surrounding coordinate space or by modifying only the positions of object elements within that space. Such a transformation cannot change the number of branches in a network, or the order in which they separate from each other.) The Net subclass of Meta-Shipper exists to describe flow that approximately follows paths (such as tubes of nerve bundles), rather than volumetric diffusion. This may be modeled as purely a network of zero-thickness spatial curves (in mathematical terms, an "embedded graph"), or at a finer level by descriptions of the tubes or other structures that follow these curves. The Tree subclass of the Net subclass further specifies that the Net is connected and branching structures never reunite, so that between any two points on the network there is exactly one non-repetitive pathway along the curves of the Tree.

A preferred embodiment of the present invention contains at least these two Meta-Shipper subclasses of Tree and Net. The Meta-Shipper may also contain the necessary algebra to compute a "lumped" transfer model between the root of the tree and the collection of its free branch-ends, where the ends have common values for all relevant parameters, or between free ends of a Net. In some cases the lumped version of a Net may be a Tree.

Exemplary Shippers

This section describes systems for building specific Shippers.

Geometric Modeling System. A Geometric Modeling System is defined as a class that contains (but is not limited to) software implementations of the following methods. Geometric models within the overall system may be created and added to the atlas by importing the individual geometric models from individual anatomical maps, using the appropriately selected geometric model with other Shippers (as functionally defined by the characteristics described above) or individual maps in the system, and the positions of their contract points with other Shippers defined and edited by 3D interface tools. The user can also use interactive control elements (mouse, joy-stick, touch screen, laser pointer, etc.), or a reach-in element (hand-eye coordinated 3D pen, etc.) to create or modify shapes, calling on system functions such as collision detection to perform fine adjustments of the Geometry to remove overlaps between pre-existing and new Shippers, where these overlaps are forbidden to coexist. Such coexistence may be permitted where they are convenient for particular viewing purposes. For example, veins within the liver may be most conveniently treated by allowing a point that is being evaluated for treatment to be within a vein, and within the liver, rather than include the vein-liver boundary in the description of the liver's surface. The Geometric Modeling System includes a number of Meta-Shippers, as discussed above, and may include an application programmer interface ("API") by which the user can create and integrate new Meta-Shippers.

A discussion of active geometric models that adapt themselves to image data can be found at L. Cohen et al., "Using Deformable Surfaces to Segment 3D Images and Infer Differential Structures", 56(2) Image Understanding 242-263 (September 1992).

Process Modeling System. A Process Modeling System is defined as a class that contains (but is not limited to) software implementations of the following methods.

Within a Shipper, it is necessary to specify the Variables whose interaction inside the Shipper is modeled, and the rules by which they are to interact. A user interface ("UI") allows the user to list or attach these variables to a name and an abbreviated symbol, and state whether each variable is to be treated as uniformly present in the Shipper (represented by a single number defining concentration or total quantity), or as varying from point to point. If all variables are spatially uniform, the system computes with an interaction model that ignores position with regard to the Shipper. For a spatially varying quantity, the UI asks for the rules and quantities governing diffusion and other forms of transport for the material represented.

The interactions between Variables may be entered in the form of differential equations, rate coefficients for standard chemical kinetics, position sensitive histograms, look-up tables, or flow diagrams with blocks and curves that may be dragged from a menu, each of which acts by assigning rates as prompted for the reactions represented by the curves. Computation of these may be combined with the use of methods described in the above-mentioned co-pending, commonly assigned U.S. patent application Ser. No. 09/745,039, filed Dec. 20, 2000 and titled "A Method for Dynamic Characterization of Density Fields in a Compound Structure", which describes a method that supplies a dynamic vector map of properties within a region or a unified suite of quantification functionality for property functions, such as density Reactions, conduction functions (e.g., thermal conduction, electrical conduction, atomic or subatomic mass conduction, macromolecular mass conduction), defined on, defined in or defining a 3-D space, which functions may optionally vary in time. There should be at least two services assisting in the definition of the map or suite, even in a dynamic modality, selected from:

(a) Computation of the volume of the region where the density lies above or below a specified threshold, or between two specified values.

(b) Computation of the integral of the density (e.g., determining a total amount of material within the region).

(c) Estimation of the rate of change of the density with respect to time, optionally restricted to a specified region.

(d) Estimation of the local or global failure of conservation represented by changes with time in the density, whether or not the method is given an implemented transport model.

(e) Estimation of the local or global rate at which material with a changing density is passing through a specified surface (e.g., boundary), whether or not the method is provided with an implemented transport model.

(f) Separation of the density of a material with a changing density, given an implemented transport model, into "free"

and "bound" densities in combination with an implemented transport model which computes the rates of change of a spatially-varying density by numerically simulating the kinetics and movement of the material (cells or molecules) in question.

The function (b) would provide the input for a rule that specifies the amount or rate of said or another material to be shipped between Shippers P and Q, given the absolute amounts or mean density of the material currently in the Shippers, or—using (f)—currently "free" in the Shippers. (For example, a gland may secrete a second substance in proportion to its internal quantity of a first substance, and transfer that secretion to the blood, to surrounding tissue or to a portal system.) The function (c) would provide the input for a rule for the same purpose, that also or instead requires as input specification of the current rate of change in one or both of the Shippers. If the substance is transformed to another substance upon which such a rule depends, but whose quantity is not directly measurable, function (d) may give an estimate of the rate of production of said second substance, and hence provide input to the rule. Function 25(e) is directly the estimation of a shipping rate between two regions considered as Shippers, via a common surface considered as itself a Shipper. Similarly, for each point specified as a location of physical contact between Shippers, the user can select which state variables represent values transferred between Shippers, the laws that determine the transfer rate, and modifications that will be imposed or which occur in the process of transfer.

Data-Driven Modeling System. A Data-Driven Modeling System is defined as a class that contains (but is not limited to) software implementations of the following methods. It is possible to construct a geometric model directly from data, given a decision procedure as to whether a point in a 3D scan corresponds to tissue of a particular type. (This may be as simple as asking "Is the density above a certain threshold?" by which bone may be recognized in a CT scan.) The data-driven modeling system includes a number of such tests, and user-selectable means of constructing surface geometries for connected sets of points of a common-type, either by "bottom-up" constructions like Marching Cubes or Skeleton Climbing, or by variational methods where a surface with appropriate topology warps itself to surround such a set of points as closely as possible while satisfying appropriate smoothness constraints.

The system can perform channel construction, as follows:

A Diffuser specifies at each point a symmetric tensor D of diffusion constants. (Typically, it is specified by value at a finite list of points, such as grid points or vertices, and interpolation rules are provided or given for points between the grid points or vertices; or, the tensor may be specified by giving finite element function coefficients on a set of 3D patches). Even where a material or signal preferentially travels along a set of disjoint paths, this field of tensor values may be used to compute transmissions or transfers; however, in such cases, there often may be a more economical and informative method, as follows.

If a Volume V is filled with disjoint paths (e.g., the cabling mass of white matter in the brain is full of neurons), the tensor D at a point p has a positive distinct eigenvalue with eigendirection tangent to the path through p, and a double zero eigenvalue with eigendirections orthogonal to the path. This situation, or an approximation within a chosen tolerance, is easily recognized and a line field of the dominant eigendirections recovered. (In the example, the white matter of the brain, diffusion and nerve impulse transmissions through a point p are not strictly along a single path through the point p, but the line field of dominant directions remains well defined as long as the largest eigenvalue is everywhere distinct, and therefore the following procedure remains of biomedical interest.) Such a line field may always be integrated to reconstruct the curves to which it is tangent, giving a unique pair of entry/exit points on the boundary of V. When the system is entered by one member p of such a pair, the curve that p is on leads to a unique exit point p'. Moreover, integration of the resistance (reciprocal of the eigenvalue at each point) along the curve joining the two points gives an overall transfer resistance R between them. This correlation of points provides a fast and economical transfer matrix model for transmission through V, considering V as a Shipper. Integration of the eigenvalue fields for directions orthogonal to each curve given a measure of the spread between curves, zero in the ideal case of transfer only along curves, and of reasonable accuracy where the orthogonal eigenvalue fields are small relative to the larger one. If there is a pressure difference, a concentration difference, or in the electrical analogue a voltage difference of P between points p and p', this measure of spread gives an estimate of P $e^{-\delta^2/\sigma^2}$/R for the transfer rate between p and a surface point a specific distance from p'. It may also be possible to use a 2×2 matrix relating directions at p tangent to the surface of V to such surface-tangent directions at p'.

Figure 3:
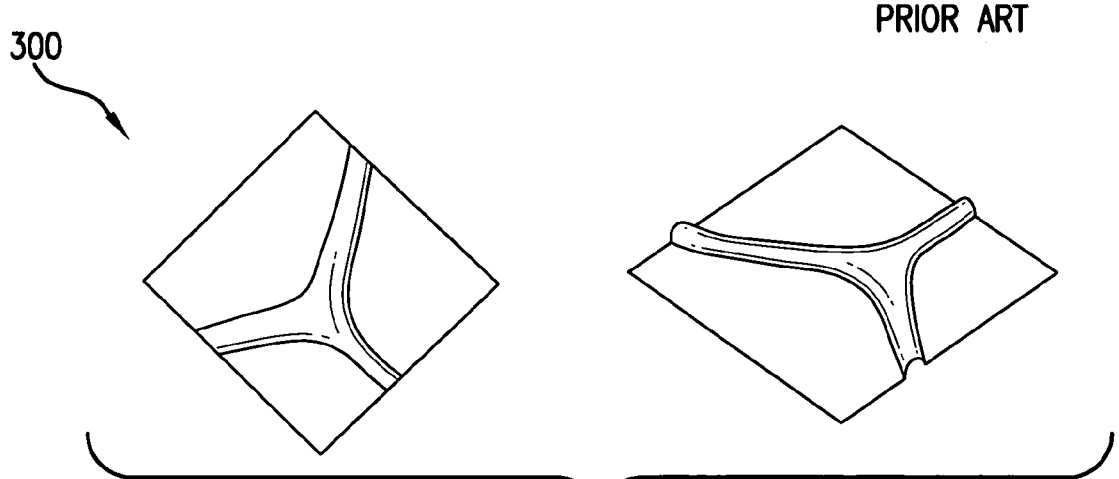
FIG. 3 shows a 2D density function (as contours and as a graph) analogous to the 3D densities from which it is desirable to extract branching curves representing channels.

In the setting of a network or preferred channels such as tubes, the situation is different. Away from a channel, the tensor D is small. At a point p strictly within an open, fluid-filled channel, a diffusion tensor is comparatively large, and isotropic (a 3×3 matrix with three equal entries on the diagonal, zeroes elsewhere, reflecting indifference to direction). However, the available estimate of tensor D at point p will often be based on sampling that includes points outside the channel, so that the most robust indicator of channelness is simply a large value of D, as measured by the summation D of the squared values of its entries. This 3D scalar field has the analogue of the ridges shown in FIG. 3. FIG. 3 shows a 2D density function, as contours (left) and as a graph (right), analogous to the 3D densities from which it is desirable to extract branching curves representing channels. This is further complicated in the brain (although not in such tube-rich organs as the liver) by the blood-brain barrier, which causes an apparent value of zero for measured diffusion of contrast material that does not pass the barrier (although for substances which do, D should be large). For such cases the narrow ridge is replaced by a narrow valley, and a change of sign is needed to apply ridge detection logic.

Channel curves may be fitted to intensity ridges in various ways. One may build them "bottom-up", from chains of high-$\|D\|^2$ points much as described for 2D in: http://dai/ed/ac/uk/Cvonline/LOCAL_COPIES/MARBLE/medium/contours/boundary.html.

One then weeds out the shorter point-chains so constructed, optionally also removing pieces of the curve that are connected to no other pieces of the curve, or that have a free end not appropriate as an exit point of the desired network, and assembles a network from what remains. Note that since connectivity is important in the result, and the curve under construction is not an edge, it is important that the chain-building process should allow branching; many variants of such construction are intended for the contraction of edge curves, which generally do not branch, and therefore the construction process forces the construction of simple curves.

Another way to fit curves to such data is the use of "snakes". Again, much of the use of active geometry has been to find branch-free boundary curves, so that any algorithms used must be adjusted in this practice to detect branch points and form the appropriate topology. It is characteristic of such branch points that the locally averaged $\|D\|^2$ values are generally higher than those values along the channels that emerge from them, because a local sampling includes more in-channel points. Indeed, as in the case of the lymphatic system, there may be a thickening nodal structure at such points. (If the sampling resolution is high enough that many in-channel points give maximal, isotropic $\|D\|^2$, then we may deliberately use a more coarsely sub-sampled version for the channel-identification purpose). Thus a particularly appropriate method is to identify such branch points first, and then, beginning with the nearest pair p and q of such points, use a snake whose ends are tied to p and q to seek a channel joining them. If the snakes converge to a curve for which $\|D\|^2$ is always above a threshold value, the algorithm keeps the curve as a segment of the network.

Note that prior knowledge is useful here. If the channel system believed to be present may be assumed to have "tree" topology, the construction algorithm may seek the single best channel joining a given p and q. If not, the algorithm must allow multiple channels between the same branch points, slowing and complicating the search.

Once curve segments are constructed, we can estimate channel width along the curve segments, constructing (if required) a tube model, and specifying transmission characteristics along each segment.

Theory-Driven Modeling System. A Theory-Driven Modeling System is defined as a class that contains (but is not limited to) software implementations of the following methods. For example, if a region is identified as a brain ventricle by anatomical features, or if a model ventricle is what one is seeking to construct, the region's diffusion properties are simply those of cerebrospinal fluid, which may be inserted without reference to measurements made on an individual basis. Similarly, speeds for the nerve impulse and for the migration of cells along neural pathways may be inserted from the background knowledge or theory validated for the general case, without identification of actual properties from particular cases, given that a neural pathway is in question. Therefore, the Shipper construction tools include an interface by which the builder of a Shipper can "parachute" transfer mechanisms and parameters into the model, without having to derive them from data available within the instantiation system.

Modes of Use

The logic of the system is not intended to support only one kind of use or one user, but to integrate the work of researchers and clinical workers in a variety of medical disciplines. In a preferred embodiment, emphasis is on the brain. Hereinafter are described some representative uses. These representations are not meant to restrict the application of the invention to these specific instances.

Clinical Uses

Figure 1:
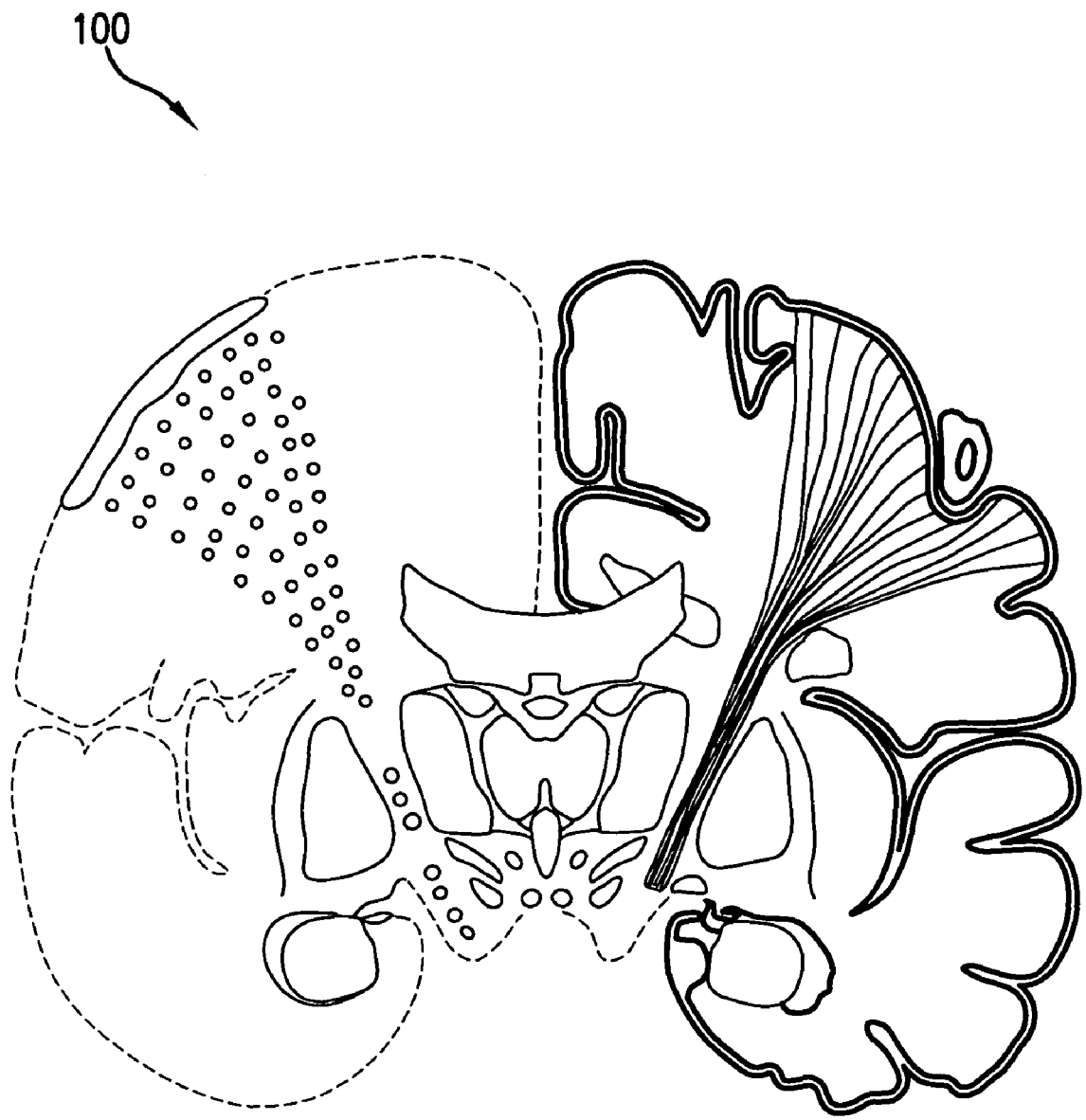
FIG. 1 shows a typical slice from a standard brain atlas, showing region outlines precisely and neural connections as dotted planar curves.
Figure 2:
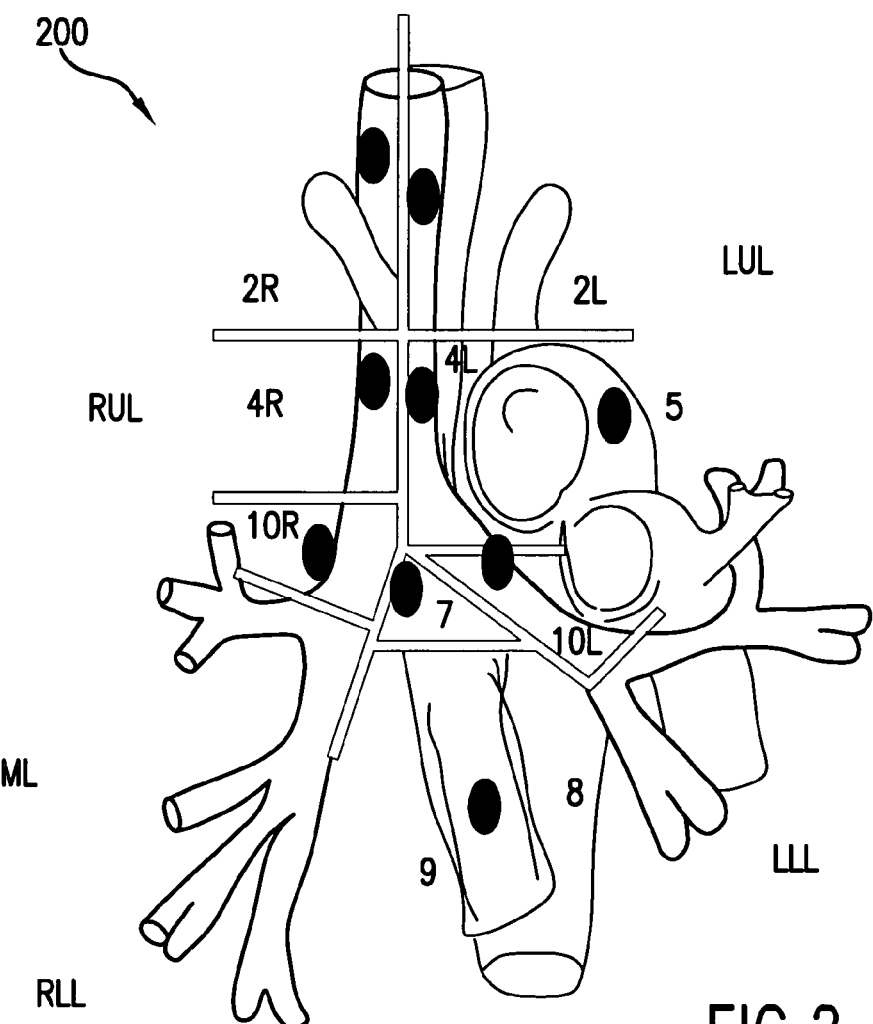
FIG. 2 shows a typical published "road map" of lymphatic connections.
Figures 5, 6:
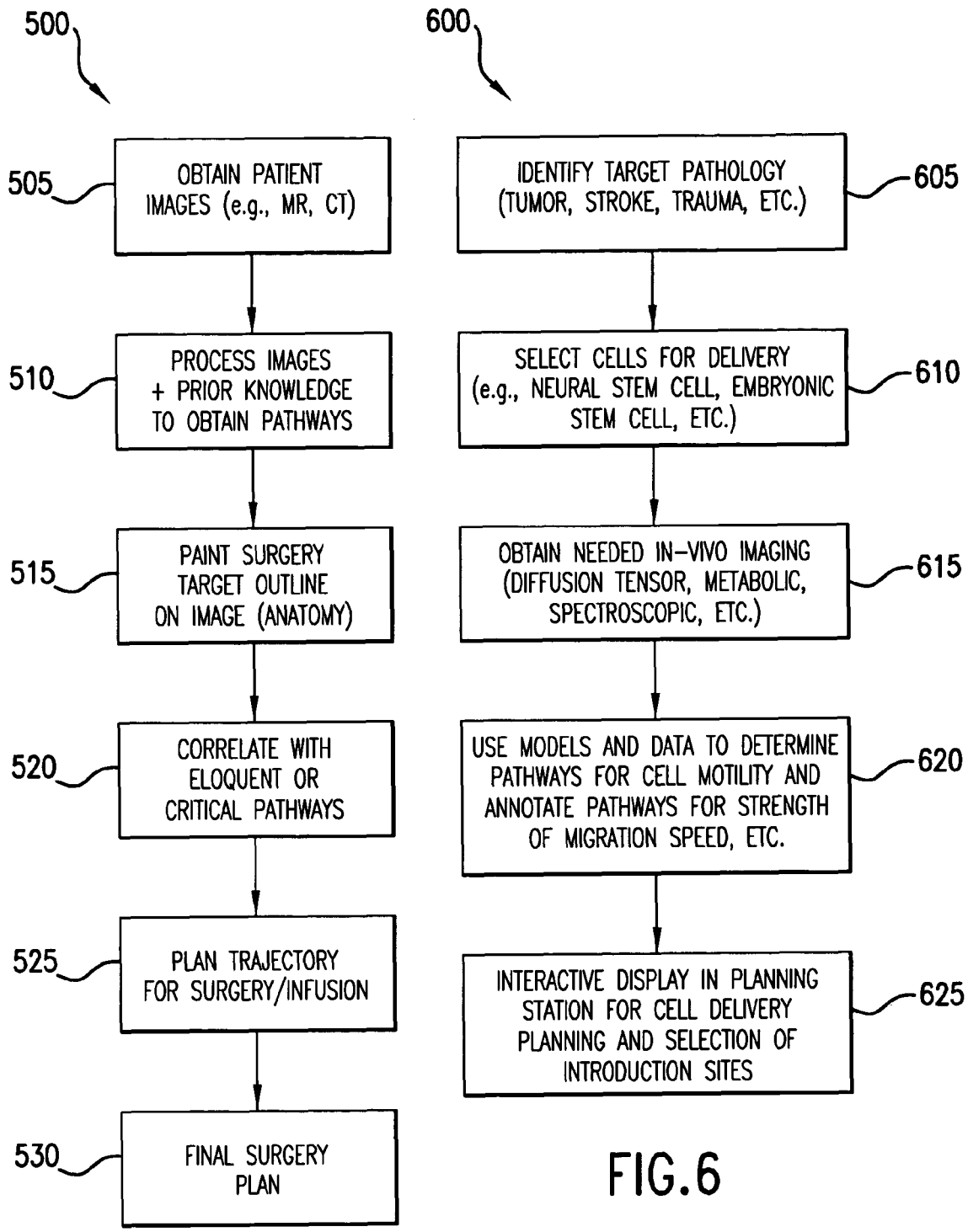
FIG. 5 illustrates structure 500 of a dialogue with a surgery planning system, delivering information necessary to reduce risk to significant pathways, according to one embodiment of the present invention.
FIG. 6 illustrates structure 600 of a dialogue with a cell delivery planning system finding targetable locations for cell insertion from which inserted cells will migrate to the final desired target, according to one embodiment of the present invention.

Risks to Pathways. FIG. 5 illustrates a use that reduces risk to significant pathways. Medical interventions should not, where avoidable, interfere with the proper running of pathways. A brain surgeon driving a probe through the brain, or opening a hole wide enough for work visually guided with a microscope, should not breach important nerves or arteries. However, these features are not always obvious at the stage of surgery planning, or even at the term of actual surgery. The 2D curves in FIG. 1 are of limited help in planning a cut or a probe path to avoid the 3D nerve bundles that they represent. To the naked or microscope-aided eye, the nerve bundles form part of the mass of white matter, rather than visible strands. (For example, it is important not to damage a patient's speech center, but the surgeon should also preserve its links to the motor cortex if the patient is to speak after the operation.)

FIG. 5 illustrates structure 500 of a dialogue with a surgery planning system delivering information necessary to reduce risk to significant pathways, according to one embodiment of the present invention. In this specific context, the present invention would not serve as a stand-alone piece of software, with its own UI. Rather, a software package might enable the user to specify a proposed intervention. (For example, current stereotactic probe planning software can be used to specify a target point and an entry point in displayed 2D slices.) FIG. 5 shows how a package would pass the geometric specification of the probe path to the software embodying the present invention, which would report any pathways near the path, the chance of impact and/or damage given the uncertainties of the data, and the structures whose interaction along such pathways is under threat. The planning software would then display this information, or a chosen subset of the information, to the user. The present invention would provide similar services to more elaborate planning/simulation software in which the user plans a wider hole through the skull and brain, and/or an intervention based on entry via a catheter, or any intervention whose region of impact can be geometrically delimited.

Referring to FIG. 5, in step 505, patient images are obtained. In step 510, images are processed and prior knowledge obtained to structure a pathway. In step 515, a surgery target outline is painted on the image. In step 520, the trajectory for surgery/infusion is planned. In step 525, the trajectory plan is correlated with eloquent or critical pathways. In step 530, the final surgery plan is mapped.

Indirect Delivery Planning. FIG. 6 illustrates an indirect delivery planning use. Many forms of treatment require the delivery of particular materials to particular places in the body. For example, cell therapy seeks to place dopainine-producing cells in brain locations where they can contribute to the alleviation of Parkinson's Disease. Often these target locations are deep within the brain, and are difficult to reach without collateral cell or tissue damage. Where the materials for delivery are active and mobile, as many cell types are, they often have preferred directions and routes of migration.

FIG. 6 illustrates structure 600 of a dialogue with a cell delivery planning system finding targetable locations for cell insertion from which inserted cells will migrate to the final desired target, according to one embodiment of the present invention. Planning software for cell insertion could query the software embodying the present invention, obtain a list of structures and locations from which cells would preferentially migrate toward the chosen target, and display them, optionally including the projected pathways. A user who chooses such a location as a candidate for indirect delivery of cells to the target could cause the planning software to query and display other locations where delivered cells would go. Such user interaction and display forms an essential part, however, not of the present invention (for which that would comprise an ancillary feature of the invention) but of the cell delivery planning software for which it would be appropriate to manage (for instance) knowledge of where cells of the chosen type might cause undesired side effects.

Referring to FIG. 6, in step 605, the target pathology is identified. In step 610, cells for delivery are selected. In step 615, needed in-vivo imaging is obtained. In step 620, models and data to determine pathways for cell mobility are used and pathways for strength of migration, speed, etc. are annotated. In step 625, an interactive display planing station is made for cell delivery planning and selection of introduction sites.

Figure 7:
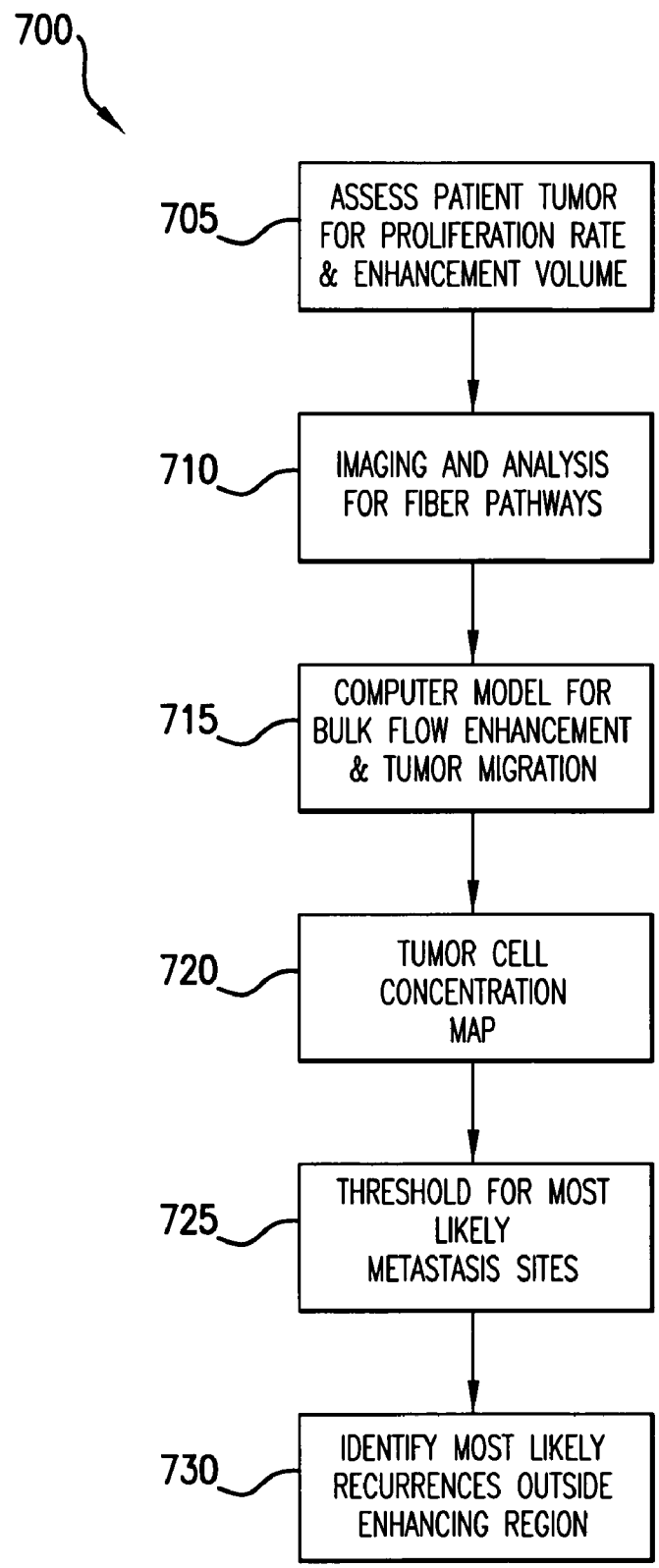
FIG. 7 illustrates structure 700 of a dialogue with a diagnostic software module which knows of certain tumors and queries the system to identify likely metastasis sites, according to one embodiment of the present invention.

Metastasis Routes. FIG. 7 illustrates how the system can be used for likely metastasis routes and sites. The same preferred cell migration routes relevant to cell delivery planning are also significant for the spread of cancer. It is, for example, useful to excise a tumor that has not begun metastasis. If cells from the tumor have migrated and the migrating cells have begun to form secondary tumors, the effort and pain of the surgery may be wasted.

FIG. 7 illustrates structure 700 of a dialogue with a diagnostic software module which knows of certain tumors and queries the system to identify likely metastasis sites, according to one embodiment of the present invention. Cancer radiology software could specify a tumor location to software embodying the present invention, and obtain a list of places where new tumors are particularly likely to have begun. These would receive particularly close examination by the radiologist, using tools (both of bioassay and of image processing) outside the scope of the conventional practice, in search of secondary tumors. If such secondary tumors, along with the primary, seem operable, queries specifying the secondary locations can specify sites at risk for tertiary tumors.

Referring to FIG. 7, in step 705, the patient tumor is assessed for a proliferation rate and enhancement volume. In step 710, imaging and analysis is performed for the fiber pathways. In step 715, a computer model is made for bulk flow enhancement and tumor migration. In step 720, the tumor cell concentration is mapped. In step 725, a threshold is determined for the most likely metastasis sites. In step 730, the most likely recurrences outside the enhancing region are identified.

Figure 8:
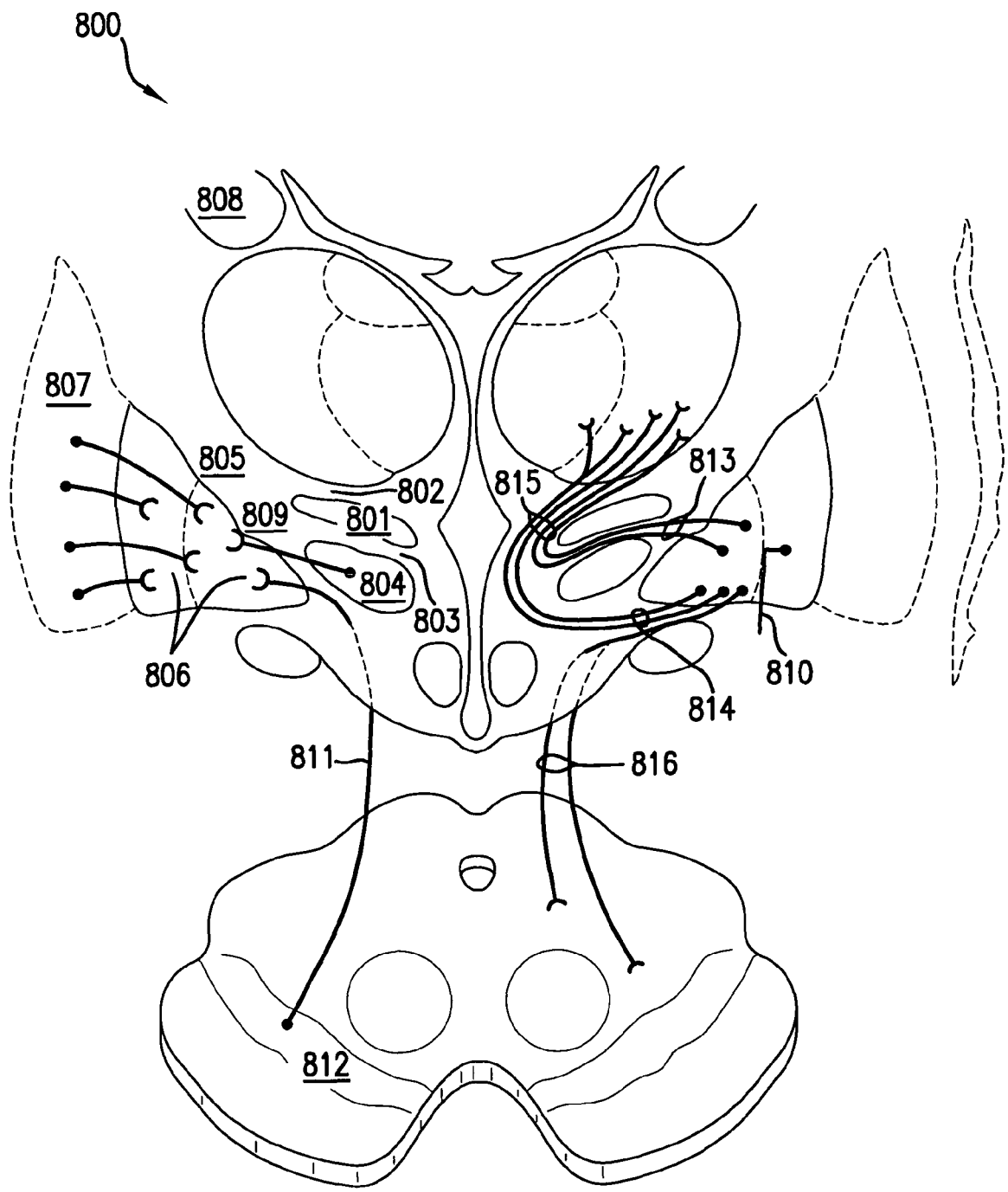
FIG. 8 illustrates interactions 800 among structures surrounding the sub-thalamic nucleus (STN), by which it may be localized even though in itself hard to locate directly in a live patient, according to one embodiment of the present invention.
Figure 9:
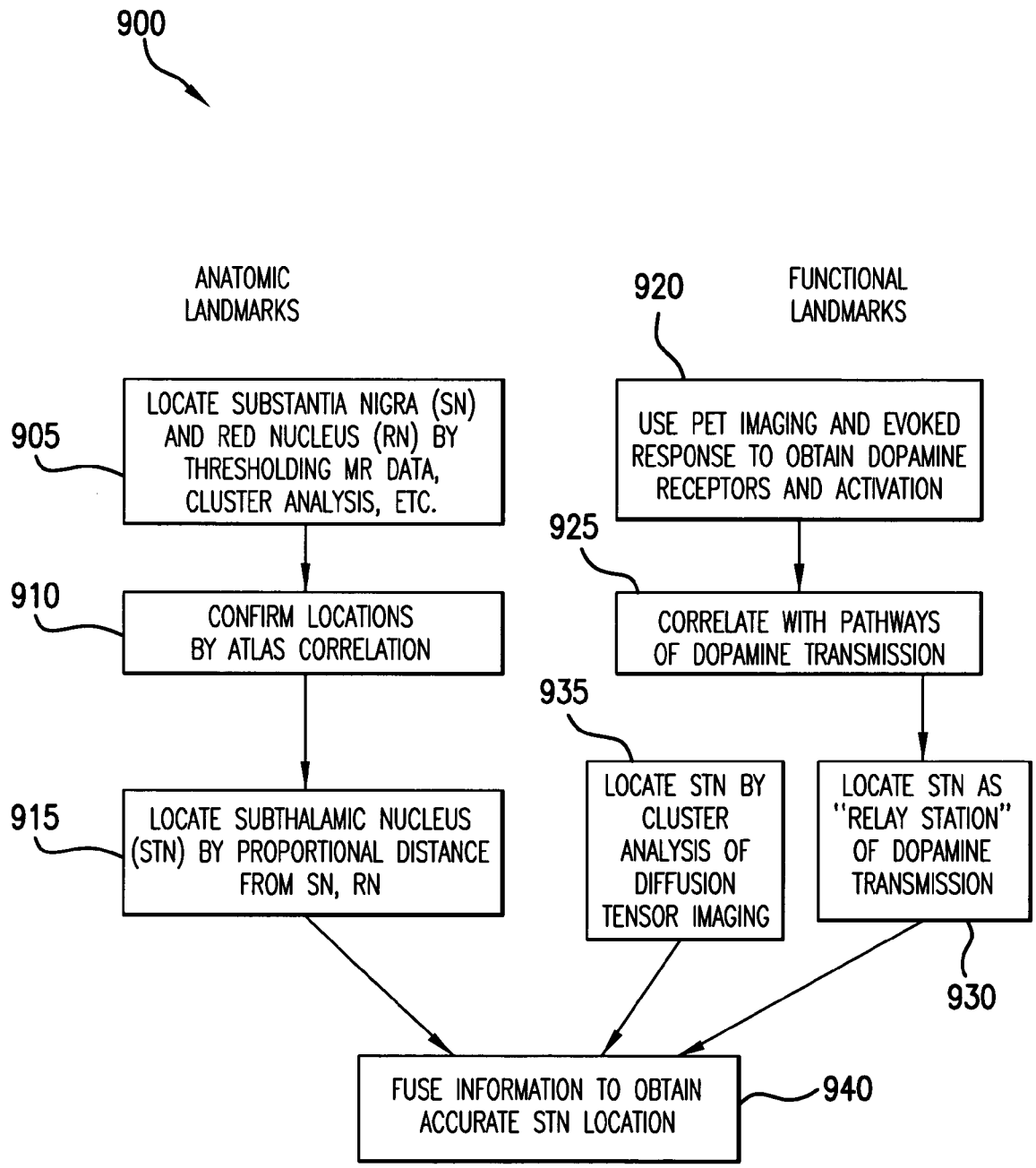
FIG. 9 illustrates structure 900 of a dialogue with a brain exploration system by which a hard-to-detect system, such as the sub-thalamic nucleus, can be more rapidly located by its relationship with surrounding structures, according to one embodiment of the present invention.

Functional Localization. FIGS. 8 and 9 show examples of using the system in functional localization. FIG. 8 illustrates interactions 800 among structures surrounding the sub-thalamic nucleus (STN), by which it may be localized although in itself hard to locate directly in a live patient, according to one embodiment of the present invention. Many brain structures, such as the sub-thalamic nucleus (STN), are hard to identify in non-invasive scans such as Magnetic Resonance Imaging (MRI). With currently known pulse sequences used in MRI, there is no adequate contrast between points in the STN and points outside the STN. Thus, when for functional reasons the surgeon wishes to act on the STN (e.g., to prevent it from contributing to the symptoms of Parkinson's disease), its position must be guessed at from the known location of more findable or viewable neighbors. (As its name suggests, the STN is just below the thalamus). Since this is not accurate enough, the guess must be followed by a procedure of probing with electrodes and observing responses, for a period as long as six hours, before the intended surgical intervention can even begin.

Referring to FIG. 8, 801 represents the zona incerta, 804 represents the sub thalamic nucleus, 805 represents the insula, 806 represents the globus pallidus, 804 represents the putamen, 808 represents the substantia nigra, 813 represents the lenticular fasciculus, 815 represents the thalamic fasciculus, and 802, 802, 810, 811, and 814 represent afferent and efferent connections.

FIG. 9 illustrates structure 900 of a dialogue with a brain exploration system, by which a hard-to-detect system such as the sub-thalamic nucleus can be more rapidly located by its relationship with surrounding structures, according to one embodiment of the present invention. Many motor cortex pathways of chemical and neural signals involve the STN. When the patient is conscious in a magnetic resonance scanner, functional MR can detect the use of oxygen in particular brain tissues, as the patient performs different physical or mental actions. There is no one action that makes the STN stand out separately, but a suite of actions allows software to accurately localize the instantiation for this type of patient of the motor cortex sections of the pathway map, by building a map or atlas consistent with all activity patterns seen and the characteristic spatial relationships between the active sites. In particular, this type of activity would locate the STN.

Referring to FIG. 9, in step 905, substantia nigra (SN) and red nucleus (RN) are located by thresholding MR data, cluster analysis, etc. In step 910, locations are confirmed by atlas correlation. In step 915, subthalamic nucleus (STN) is located by proportional distance from the SN and RN. In step 920, PET imaging is used and a response is evoked to obtain dopamine receptors and activation. In step 925, this is correlated with pathways of the transmission. In step 930, the STN is located as a "relay station" or the dopamine transmission. In step 935, the STN is located by cluster analysis of diffusion tension imaging. In step 940, all information is fused to obtain an accurate STN location.

Research Uses

Figure 10:
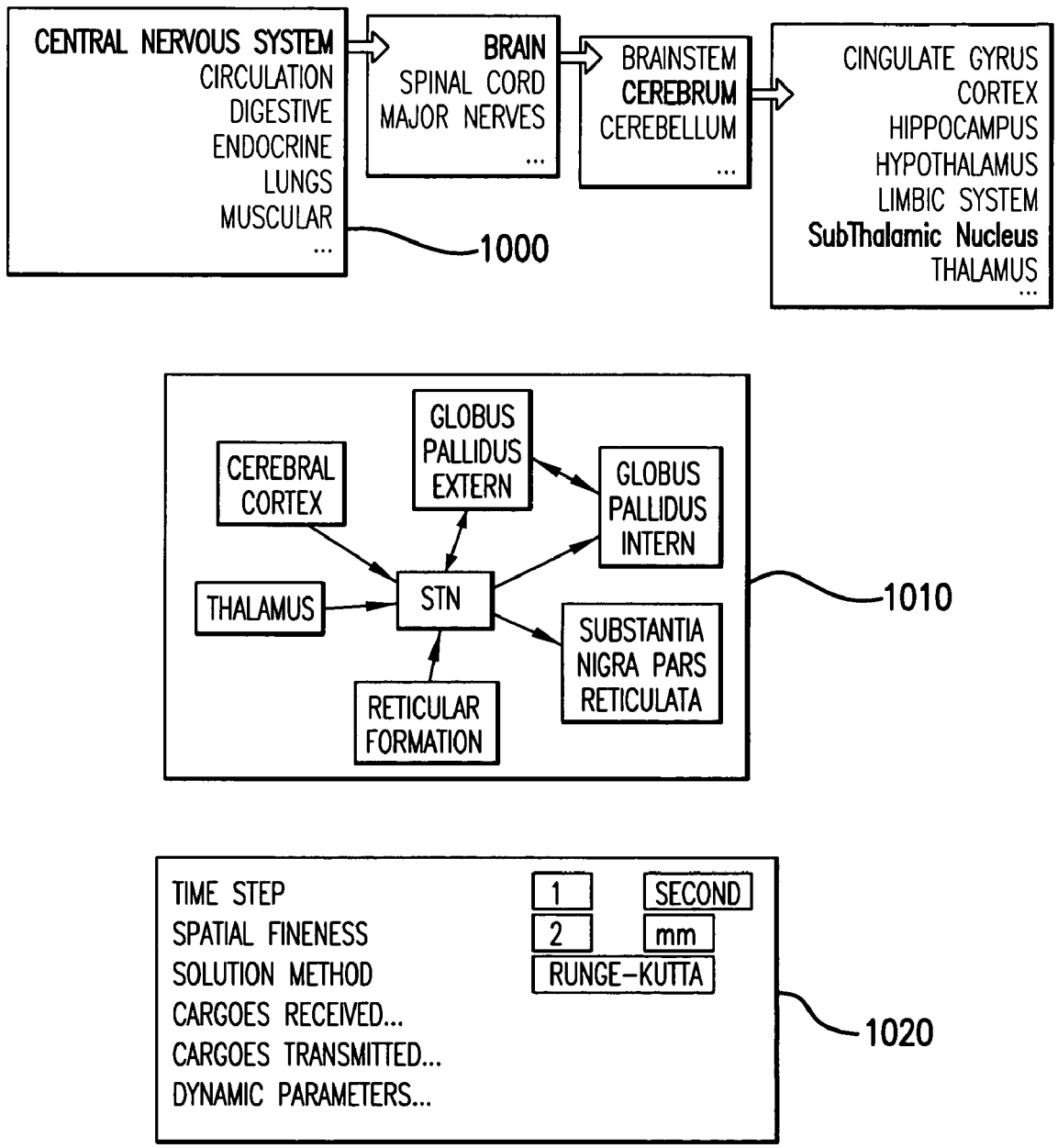
FIG. 10 illustrates principal inputs and queries by which a researcher can build a model of a multi-site disease, according to one embodiment of the present invention.

Multi-Site Diseases. FIG. 10 illustrates principal inputs and queries by which a researcher can build within the system and method a model of a multi-site disease, according to one embodiment of the present invention. The researcher clicks in a hierarchically organized menu 1000, selecting (for example) "CNS/Brain/Cerebrum/Thalamus" and perhaps other Shippers such as endocrine glands, as a starting point. A display 1010 shows a modifiable View of the selected structure(s) together with the known Contacts between them, either as a geometrically/anatomically correct View with other anatomy suppressed, or as an abstract graph of labeled objects and connecting curves. In one embodiment, either display is 3D, whenever convenient interface tools are available for the user to manipulate and select 3D objects, rotate the View, etc. (A mouse-pad interface makes a 2D graph display the most usable, but a variety of Virtual Reality based interfaces now allow a more natural interaction.) An appropriate click on a displayed Shipper or Contact can remove it from the display. Clicking on an object or Shipper selects it. By menu choices or gesture the user can add to the display the other objects known to be connected to a selected object. For example, in 1010 with the internal segment of the globus pallidus selected, this would add the thalamus. In constructing a dynamic model, inputs from and responses of tissues not explicitly included in the display, but that modify parameters in the behavior model for an included Shipper or Contact, are assumed to take average values, if these are known. If not, the system queries the user for values. The user may also independently call up (for any selected Shipper or Contact) the input screen 1020 for modifying such values, along with other parameters to be used in running the model. Clicking an entry with an ellipsis (" . . . ") produces a subscreen showing the parameters specific to the current model, with fields by which the user may modify them. By this means the user may change the model to make a Shipper or Contact behave abnormally (for example, over- or under-producing a Cargo, responding abnormally to a Cargo, or failing to transport). This may either model a disease process, where the abnormality occurs spontaneously, or a proposed therapy in which a surgeon may excise or burn a connection between two tissues that is not in itself pathological, so that the system behavior is less damagingly affected by pathology elsewhere. For example, the various forms and symptoms of Parkinson's disease involve misfunctioning of the system in certain regions of the brain. Treatment of the disorder rarely involves repair of a damaged component of a pathway. More commonly, cells are added, or an element is removed or electrocuted in such a way that the further-damaged or modified cell network no longer produces particular symptoms, such as tremor. The point of intervention determines which symptoms are alleviated, and what side effects of additional deficit result.

This is an example of a disease (or group of diseases) which is best understood as malfunctioning of a network of brain elements, rather than of one element. Even where one element is clearly implicated, the treatment does not typically fix or address solely that element, but adjusts the network by intervention elsewhere to produce results less distressing to the patient. Parkinson's is now fairly well understood, but the class of diseases with such network aspects can be expected to grow rapidly. Researchers mapping them would consult the general pathway map embodied in software implementing the present invention to locate known pathways, and add to those maps the related map information or distinct map information or knowledge they gather in research, further enhancing the system for the use of other researchers.

The system provides a command by which the model constructed may be run for a specified length of (virtual) time, and at least one means to view the results of the simulation, which an implementation or user may select from possibilities including, but not limited to, graphs of selected variables with time, 2D or 3D phase diagrams jointly showing the motions of selected variables or combinations of them such as sums, colored shapes attached (singly or in groups) to Shippers and Carriers in the display 1010 and varying in color according to numerical value, volume of audio signals at frequencies associated with particular variables, palpable vibrations delivered by a haptic device, or changes in the displayed size and/or shape of the representation of a Shipper or Carrier.

Figure 11:
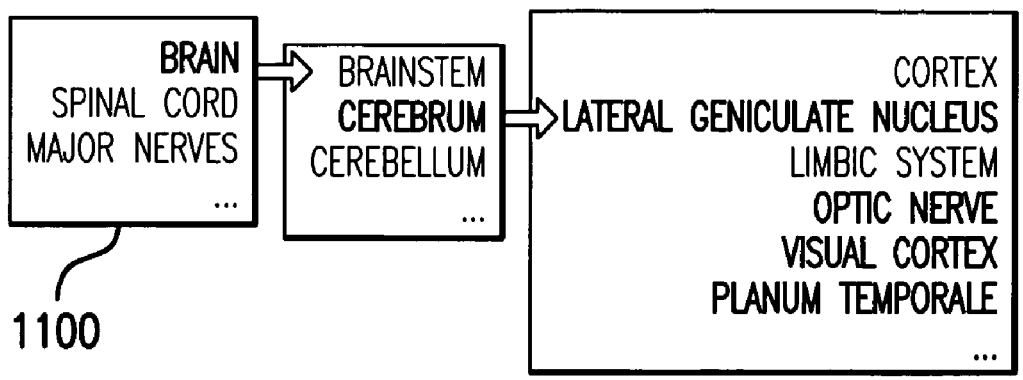
FIG. 11 illustrates principal inputs and queries by which a researcher can build a model of an interactive process by which the brain as a whole responds to an external event, according to one embodiment of the present invention.
Figure 11:
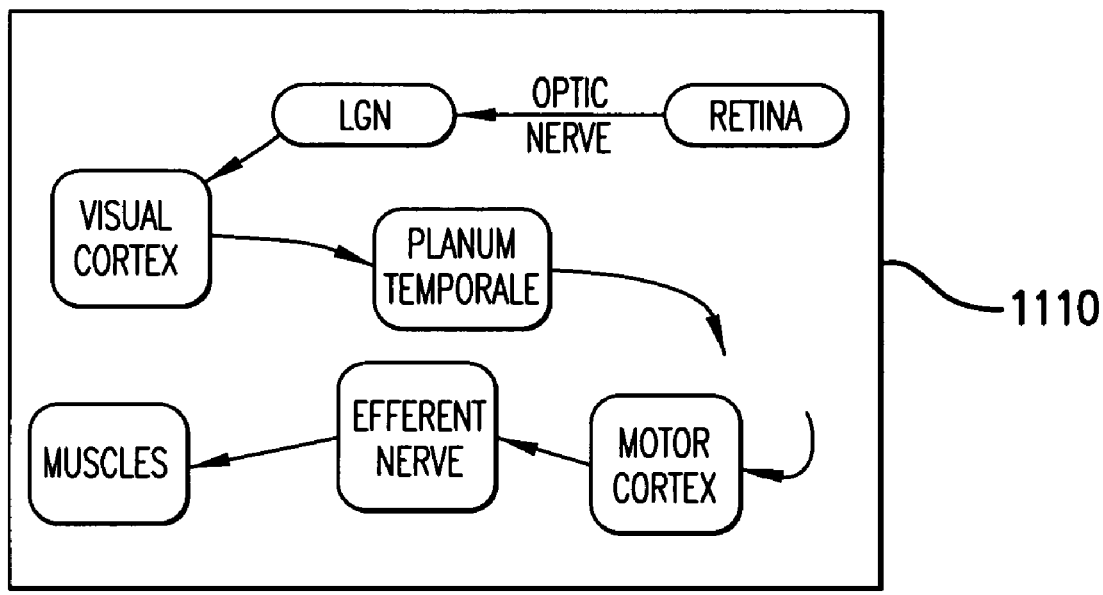
Figure 11:
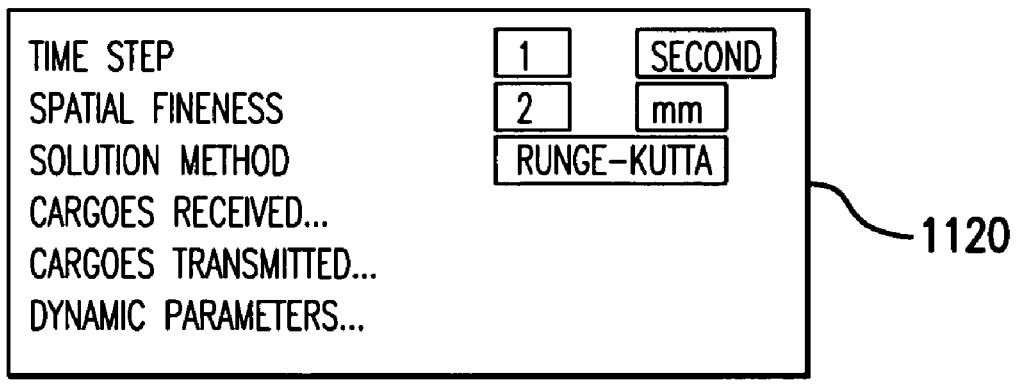

Neuropsychology. FIG. 11 illustrates the principal inputs and queries by which a researcher can build within the system a model of an interactive process by which the brain as a whole responds to an external event according to one embodiment of the present invention.

Referring to FIG. 11, for most brain centers, it is not yet known how data such as representations of objects external to the person are physiologically structured and stored, or the form in which they are communicated to other centers. However, measures such as PET scans and functional MRI are making it possible to track to some extent the impact of activity in one center upon those in another, and the timing of such impact. It can be important to address questions such as the speed at which the whole brain can respond when a particular sensory signal (odor, touch, object in view, etc.) is received, when multiple centers are necessarily involved. As a simple example, a roadside "lane closed" warning has to stimulate the retina, pass through the optic nerve and certain ganglia to the visual cortex at the back of the head, be analyzed into letters and resynthesized as a set of words in the language center of the brain (planum temporale), translate these words into spatial information about the surroundings, connect with dynamic information to create awareness that the car will hit the lane closure on its present path, leading to conceptualization of an alternate path and planning and direction in the motor cortex and implementation by the muscles of activity that will bring about motion in that alternate path. This "simple" example may be timed directly, but to compute its timing from a deeper knowledge of the brain, a network model such as the present invention is more convenient than an ad hoc assessment of the path times involved just as a spreadsheet is more useful than a table which can only contain numerical values. For more complex interactions, or to improve timing in mission-critical responses where finer analysis can lead to stimuli that are processed faster, a systematic environment such as the present invention is essential.

FIG. 11 shows the process by which a researcher uses the system to build a model of a complex suite of interactions. From the menu system 1100, the user selects systems known to be involved, which produces a display 1110 showing the tissues involved as Shippers and Contacts, and the systems connected to them. (For simplicity, FIG. 11 shows only a subset of those needed.) The user prunes away whatever in the display is not germane to the current purpose, and ends with a network for the driver's response. For each element, the user can call up a screen such as 1120, to study or modify the known parameters of that element, and the parameters to be used in simulation. In this instance, most Cargoes will be nerve impulses, but the researcher may also wish to include the chemically transmitted effects of sleepiness, alcohol, etc. The model has certain automatic functions derived from the overall modeling framework, such as answering "What is the minimum time for a change in input Here to modify values There?" which can be computed by simply adding times (without a full model of the dynamics). Other questions will require running the network model as a simulation.

This class of model may be used predictively (given what is known about brain connections, nerve speeds, etc., predict a reaction time) and interpolatively. If most but not of all of the necessary time delays are not known, psychomotor experiments that establish an overall time (to muscle action, to an evoked potential in the motor cortex, etc.) provide a framework in which the user can ask what values for the unknown delays are consistent with the overall result. This provides an indirect but powerful method of increasing the set of neural interactions for which a consistent set of timings is available, for each particular model that may be built with the system.

Additional Embodiments

It is not appropriate to bundle the above modes of use in one comprehensive software package. The above modes all make use of the core capabilities of the software objects (Shippers, Map, World, etc.), but each mode can have its own UI designed to handle different research or clinical questions. Obviously, the display functions appropriate to tracking the web of interactions of a driver responding to a road sign are quite distinct from those desirable in planning brain surgery. Therefore, the system is equipped with an API by which another component can instantiate a Map, populate it with Shippers, specify their Geometries, etc. Analogous to a commercial web site querying and up-dating a database of available products, the other component can pose questions (e.g., the rate of transmission of a particular Cargo between particular Shippers), and either call upon the drawing functions built in to the Shippers themselves, or request that they export structural and rate data in a format which the other component can render according to the requirements of its own UI. Similarly, a surgery planning system could use the API to inform the Map of the Geometry of a proposed intervention, and enquire what pathways this approaches within a specified tolerance, and optionally request export of the Geometry of the pathways to perform its own collision avoidance algorithms with its own representation of said Geometry as "antitarget". Similarly, a treatment planning system could use the API to inform the Map of the location (as point or region) of a known tumor, receiving in return the identities of one or more Shippers whose spatial position meets that location. The treatment planning system could then query the Map as to the further Shippers with which the Shippers most readily communicate certain classes of Cargoes, and obtain their spatial locations to be examine closely for evidence of metastasis, before construction of a set of targets for a surgery or radiation therapy or stereotactic injection of cytotoxic material or other means destructive of said tumor and possible other tumors discovered by said close examination.

The present invention is maintained on one or more servers, reachable in one embodiment over the Internet. A user who contacts the server(s) may download a copy or instantiation of the program, add elements and/or activity models locally, and run it on a local computer or a server. Such user-created elements or instantiations may be exchanged between users, or between a user and an archive operated by the person or institution that makes the system available to users.

The system is structured to allow heavy computing occurring within one Shipper to be handled on a separate processor, which need only communicate relatively small signals (representing agreed flow rates of Cargoes) with the processors simulating the internal dynamics of other Shippers. In a preferred embodiment, the separate processors are mutually accessible over the Internet. At least one consensus Map, representing knowledge of multiple members of the research community, is accessible via the Internet, and users can post suggested modifications or additions to such Map or Maps, or entire Maps of their own, for consideration and use by other researchers. A decision procedure among recognized members of the research community determines which posted modifications or additions become part of the consensus Map for which they are suggested.

The present invention is described in terms of the above embodiments. This is for convenience only and is not intended to limit the application of the present invention. In fact, after reading the description of the present invention, it will be apparent to one skilled in the relevant arts how to implement the present invention in alternative embodiments.

In addition, it should be understood that the Figures described above, which highlight the functionality and advantages of the present invention, are presented for example purposes only. The architecture of the present invention is sufficiently flexible and configurable, such that it may be utilized in ways other than that shown in the Figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A computer-implemented method of dynamically modeling and displaying a passage of material or information between at least two spatially distributed objects in a body, comprising:
   creating a first data set of entities between which material or information is transferred;
   creating a second data set of channels connecting the entities;
   creating a third data set of types of material or information that each entity transfers via each channel;
   creating, using a processor, a dynamic map that includes a list of active entities, wherein the dynamic map is communicatively coupled to the active entities so as to provide information thereto;
   using the dynamic map in conjunction with the first, second, and third data sets to perform a simulation of the transfer of material or information between entities; and
   outputting the simulation results.

2. The method of claim 1, wherein at least one spatially distributed object represents at least one of a group selected from: a tissue of the body; and an organ of the body.

3. The method of claim 1, wherein at least one spatially distributed object represents a device used for medical intervention.

4. The method of claim 1, wherein at least one spatially distributed object represents a material introduced into the body by accident.

5. The method of claim 1, wherein at least one spatially distributed object represents material introduced into the body by an aggressor.

6. The method of claim 1, wherein at least one spatially distributed object represents material introduced into the body for cosmetic purposes.

7. The method of claim 1, wherein at least one spatially distributed object is represented as having a spatial form and points of contact with other objects.

8. The method of claim 7, wherein at least one spatially distributed object has a geometrical description of a three-dimensional form.

9. The method of claim 8, wherein the three-dimensional form comprises a polygonal surface representing a spatial boundary.

10. The method of claim 8, wherein the three-dimensional form comprises a specification of points in a grid laid out in three-dimensional space.

11. The method of claim 7, wherein at least one spatially distributed object has a geometrical description of a two-dimensional surface.

12. The method of claim 7, wherein at least one spatially distributed object has a geometrical description of a one-dimensional curve.

13. The method of claim 1, wherein at least one spatially distributed object contains a numerical description of the condition of the at least one spatially distributed object.

14. The method of claim 13, wherein the numerical description comprises lesions of medically recognized types in a tissue represented by the at least one spatially distributed object.

15. The method of claim 13, wherein the numerical description may refer to the states at particular spatial locations within the at least one spatially distributed object.

16. The method of claim 1, wherein a signal passed between a first spatially distributed object and a second spatially distributed object depends upon the internal state of the first spatially distributed object and the second spatially distributed object, and upon an algorithmic specification characterizing the transfer capacity between the first spatially distributed object and the second spatially distributed object.

17. The method of claim 16, wherein the algorithmic specification is provided with a digital implementation of the method.

18. The method of claim 16, wherein the algorithmic specification is obtained by a user and connected to a digital implementation of the method by programming means.

19. The method of claim 1, wherein at least one spatially distributed object and at least one algorithm governing an internal state of the at least one spatially distributed object are provided with a digital implementation of the method.

20. The method of claim 1, wherein a subset of the at least one spatially distributed object, at least one algorithm governing the evolution of an internal state of the at least one spatially distributed object, and at least one passed signal are constructed by the user and connected to a digital implementation of the method by programming means provided with the digital implementation of the method.

21. The method of claim 1, wherein at least one spatially distributed object is grouped as a different spatially distributed object, and at least one algorithm associated with the different spatially distributed object is run on data associated with the different spatially distributed object to approximate the effect of the at least one algorithm on the data associated with the at least one spatially distributed objects.

22. The method of claim 1, wherein a geometrical description is modified by a global transformation specifying a correspondence between a reference coordinate space of the method and a coordinate space appropriate to a particular subject.

23. The method of claim 1, wherein a geometrical description may be modified individually to better match a corresponding entity in a particular subject to create a new hypothetical example.

24. The method of claim 1, further comprising: specifying the condition of at least one spatially distributed object; running at least one associated algorithm; and reporting the results.

25. The method of claim 1, further comprising: specifying an initial condition of at least one spatially distributed object; running at least one associated algorithm while continuing to intervene in the state of the at least one spatially distributed object in real-time; and observing results.

26. The method of claim 1, further comprising: running at least one associated algorithm on a system that resides on a central server; and having a user issue modification and simulation commands over the Internet which are executed on the central server.

27. The method of claim 1, further comprising: having a user obtain standard system data; and having the user issue modification and simulation commands that are executed on a computer.

28. The method of claim 27, further comprising displaying a three-dimensional graphical image representing a spatial arrangement of at least one spatially distributed object.

29. The method of claim 28, where the three-dimensional graphical image is color-coded.

30. The method of claim 27, further comprising displaying results as numbers.

31. The method of claim 24, where a second program issues modification and simulation commands and receives data describing the results of system computations as input for further computations by said second program.

32. The method of claim 1, wherein the information comprises at least one of a group consisting of: material; and signals.

33. The method of claim 1, wherein the library data set further maintains interaction types and characteristic times for each interaction type.

34. The method of claim 1, further comprising enabling a user to input initial conditions for the entities between which material or information is transferred, and wherein performing the simulation includes using the initial conditions as part of the simulation.

35. The method of claim 1, further comprising enabling a user to input variations of the data sets.

36. The method of claim 1, further comprising creating a data set of the response of each entity to material or information received via each channel.

37. The method of claim 36, wherein creating a data set of the response includes transfer of the same or other material or information to other entities via said channels.

38. The method of claim 1, further comprising creating a data set of the transmission characteristics of each channel for each type of material or information that the said channel can carry.

39. A computer program embodied on a non-transitory computer readable medium for dynamically modeling and displaying a passage of material or information between at least two spatially distributed objects in a body, comprising:
   code that creates a first data set of entities between which material or information is transferred;
   code that creates a second data set of channels connecting the entities;
   code that creates a third data set of types of material or information that each entity transfers via each channel;
   code that creates a dynamic map that includes a list of active entities, wherein the dynamic map is communicatively coupled to the active entities so as to provide information thereto;
   code that uses the dynamic map in conjunction with the first, second, and third data sets to perform a simulation of the transfer of material or information between entities; and
   code that outputs the simulation results.

* * * * *